(12) United States Patent
Friz et al.

(10) Patent No.: US 7,598,196 B2
(45) Date of Patent: Oct. 6, 2009

(54) VAPOR-DEPOSITION MATERIAL FOR THE PRODUCTION OF LAYERS OF HIGH REFRACTIVE INDEX

(75) Inventors: Martin Friz, Darmstadt (DE); Uwe Anthes, Erbach (DE); Reiner Dombrowski, Hoechst (DE); Beate Dombrowski, legal representative, Hoechst (DE)

(73) Assignee: Merck Patent GmbH, Darmstadt (DE)

( * ) Notice: Subject to any disclaimer, the term of this patent is extended or adjusted under 35 U.S.C. 154(b) by 414 days.

(21) Appl. No.: 11/249,765

(22) Filed: Oct. 14, 2005

(65) Prior Publication Data

US 2006/0088466 A1    Apr. 27, 2006

(30) Foreign Application Priority Data

Oct. 14, 2004   (DE)   ................ 10 2004 049 996

(51) Int. Cl.
*C04B 35/495*    (2006.01)
*C23C 16/40*     (2006.01)

(52) U.S. Cl. .............. 501/134; 423/594.17; 427/255.28

(58) Field of Classification Search ................ 501/134; 423/594.17; 427/255.28
See application file for complete search history.

(56) References Cited

U.S. PATENT DOCUMENTS 4,156,622 A      5/1979   Lindmayer
2006/0280950 A1* 12/2006  Ritz et al. .................. 428/432

FOREIGN PATENT DOCUMENTS

JP        04-325669       11/1992

OTHER PUBLICATIONS

H. John et al., "High Temperature Solid-Solubility Limit and Phase Studies in the System Tantalum-Oxygen", Journal of the Less-Common Metals, vol. 27 (1972), pp. 297-309.

* cited by examiner

*Primary Examiner*—Karl E Group
(74) *Attorney, Agent, or Firm*—Millen, White, Zelano, Branigan, P.C.

(57) ABSTRACT

The present invention relates to vapor-deposition materials comprising $Ta_2O_x$, where x=4.81 to 4.88, to processes for the preparation of the vapor-deposition materials, and to the use thereof for the production of layers of high refractive index.

15 Claims, No Drawings

VAPOR-DEPOSITION MATERIAL FOR THE PRODUCTION OF LAYERS OF HIGH REFRACTIVE INDEX

The present invention relates to vapor-deposition materials comprising $Ta_2O_x$, where x=4.81 to 4.88, to processes for the preparation of the vapor-deposition materials, and to the use thereof for the production of layers of high refractive index.

In order to protect the surfaces or in order to achieve certain optical properties, optical components are usually provided with thin coatings. Optical components of this type are, for example, optical lenses, spectacle lenses, lenses for cameras, binoculars or for other optical instruments, beam splitters, prisms, mirrors, window panes and the like. The coatings serve firstly for the treatment of the said surfaces by hardening and/or increasing the chemical resistance in order to reduce or prevent damage by mechanical, chemical or environmental influences, but frequently also secondly to achieve reduced reflection, which is the case, in particular, for spectacle lenses and camera lenses.

In this connection, tantalum(V) oxide ($Ta_2O_5$) is a known and frequently employed material for the production of layers of high refractive index. $Ta_2O_5$ layers are usually applied by vacuum evaporation. In this process, firstly the substrate to be coated and a $Ta_2O_5$-containing container are placed in a suitable high-vacuum vapor-deposition apparatus, the apparatus is subsequently evacuated, and the vapor-deposition substance is brought to evaporation by heating and/or electron beam bombardment, with the vapor-deposition material precipitating on the substrate surface in the form of a thin layer. Corresponding apparatuses and processes are conventional prior art.

$Ta_2O_5$ has the disadvantage in the above-mentioned processes that it liberates relatively large quantities of oxygen on melting and evaporation. This generally occurs until a composition of the formula $Ta_2O_{5-x}$, where x=0.2 to 0.4, has been reached. The precise composition depends crucially on the temperature of the substance during the evaporation. The liberation of oxygen causes an increase in pressure in the vapor-deposition units, which can be very great depending on the conditions and can result in termination of the evaporation.

In order to prevent this increase in pressure during the evaporation, $Ta_2O_5$ is usually pre-melted in a prior process step. To this end, a certain amount of $Ta_2O_5$ is placed in a container, the $Ta_2O_5$ is melted under reduced pressure, and the melt is allowed to cool. Further $Ta_2O_5$ is subsequently placed in the container in order likewise to pre-melt this with the above-mentioned process steps. This procedure is repeated until the requisite amount of molten material for the evaporation process has been obtained. Depending on the melt temperature and duration of the melting process, the vapor-deposition material obtained has a composition of from $Ta_2O_{4.6}$ to $Ta_2O_{4.8}$. Pre-melting is an expensive and lengthy process and is thus not suitable for the provision of relatively large amounts of vapor-deposition material.

U.S. Pat. No. 4,156,622 discloses that electron beam evaporation of a mixture of $Ta_2O_5$ and elemental tantalum on solar cells enables tantalum suboxides of the formula $Ta_2O_y$, where y=2.5 to 4.8, preferably where y=3.3 to 4.5, to be obtained. However, the above-mentioned method proves to be disadvantageous if layers of homogeneous composition are to be obtained if possible, since local inhomogeneities in the mixture result in the deposition of tantalum suboxides of various composition. Specific control of the layer composition thus cannot be achieved using the above-mentioned method.

JP 04-325669 describes a sintered mixture of $Ta_2O_5$ and Ta in which the proportion of Ta is between 4 and 55% by weight. This corresponds to tantalum suboxides having the formula $Ta_2O_2$ to $Ta_2O_{4.6}$. The tantalum suboxides obtained are evaporated by means of electron beam evaporation and applied to a substrate. JP 62-207937 discloses sintered $Ta_2O_5$/Ta mixtures in which the ratio of $Ta_2O_5$ to Ta is 9:1. This corresponds to a composition according to the formula $Ta_2O_{4.73}$.

However, the use of tantalum suboxides of the above-mentioned compositions proves to be disadvantageous since the layers vapor-deposited therewith frequently exhibit absorption in the visible region of the spectrum. This effect is undesired and can also only be eliminated by subsequent heating of the coating in air at temperatures of around 400° C. This means the necessity of a further process step which is energetically unfavorable and which in addition lengthens the production process of the desired layers. Another way of avoiding the formation of absorbent layers is the use of ion- or plasma-supported vapor-deposition processes which include the formation of ionized oxygen. These special processes and the apparatuses necessary therefore are very complex and expensive and require accurate process control in order to achieve the desired result. These processes are thus unsuitable for large-scale industrial use.

Intensive investigations have shown that increasing the oxygen content in the vapor-deposition material favors the formation of non-absorbent layers. By contrast, an excessively high oxygen content results in the undesired increase in pressure described above. The object was therefore to provide vapor-deposition materials which are capable of overcoming this paradox without a need to modify the actual evaporation process.

The present object is achieved in an inventive manner by vapor-deposition materials in accordance with the present invention. The present invention accordingly relates to vapor-deposition materials comprising $Ta_2O_x$ where x=4.81 to 4.88. The present invention furthermore relates to vapor-deposition materials comprising $Ta_2O_x$ where x=4.81 to 4.88, obtainable by mixing $Ta_2O_5$ with from 1.9 to 3.1% by weight of Ta, based on the mixture, compressing or suspending, shaping and subsequently sintering the mixture under reduced pressure.

The present invention furthermore relates to a process for the preparation of the vapor-deposition materials according to the invention in which $Ta_2O_5$ is mixed with from 1.9 to 3.1% by weight of Ta, based on the mixture, the mixture is compressed or suspended, shaped and subsequently sintered under reduced pressure.

The present invention likewise relates to the use of the vapor-deposition materials according to the invention for the production of layers of high refractive index.

The vapor-deposition materials according to the invention are advantageous in many respects. Thus, the mixtures of $Ta_2O_5$ and Ta employed for the preparation of the vapor-deposition materials exhibit very good behavior during melting, in the course of which a homogeneous and compact melt is formed. This is particularly important in order to be able to achieve a homogeneous coating without variations in the composition of the coating. On use of the vapor-deposition materials according to the invention using electron beam evaporation, absorption-free layers are obtained without an additional post-treatment being necessary. At the same time, only a slight increase in the pressure during evaporation of the vapor-deposition material is observed, i.e. only a small amount of oxygen is liberated and control and maintenance of the desired process parameters is simplified and improved. The particular ratio of tantalum to oxygen in the vapor-deposition materials according to the invention makes the combination of the said advantages possible at all and is thus essential to the invention.

The vapor-deposition materials according to the invention comprise $Ta_2O_x$ where $x=4.81$ to $4.88$; the vapor-deposition materials preferably comprise $Ta_2O_{4.82}$. The latter is obtainable by mixing $Ta_2O_5$ with 3% by weight of Ta, based on the mixture, compressing or suspending, shaping and subsequently sintering the mixture under reduced pressure. Surprisingly, it has been found that vapor-deposition materials of this composition are very particularly suitable for the production of non-absorbent layers of high refractive index therefrom.

In the processes according to the invention for the preparation of the vapor-deposition materials described above, $Ta_2O_5$ is mixed with from 1.9 to 3.1% by weight of Ta, based on the mixture, the mixture is compressed or suspended, shaped and subsequently sintered under reduced pressure. For the preparation of the preferred embodiment comprising $Ta_2O_{4.82}$, $Ta_2O_5$ is mixed with 3% by weight of Ta, based on the mixture, the mixture is compressed or suspended, shaped and subsequently sintered under reduced pressure.

The above-mentioned mixture of $Ta_2O_5$ and Ta is compacted and shaped by means of suitable compression measures known per se. However, it is also possible to prepare a suspension of the mixed components in a suitable carrier medium, which is shaped and subsequently dried. A suitable carrier medium is, for example, water, to which, if necessary, binders, such as polyvinyl alcohol, methylcellulose or polyethylene glycol, and optionally assistants, such as, for example, wetting agents or antifoams, are added. The suspending is followed by shaping. Here, various known techniques, such as extrusion, injection molding or spray drying, can be used. The shapes obtained are dried and freed from binder, for example by burning-out. This is carried out for reasons of better handleability and meterability of the mixtures. The shapes into which the mixture is brought are therefore unlimited. Suitable shapes are all those which facilitate simple handling and good meterability, which play a particular role, in particular, in the continuous coating of substrates with the vapor-deposition material according to the invention and the topping-up process necessary for this. Preferred shapes are therefore various tablet shapes, pellets, discs, truncated cones, grains or granules, rods or also spheres.

The shaped mixtures are subsequently sintered. The sintering process is carried out under reduced pressure at temperatures of from 1300 to 1800° C. and a residual pressure of below 1 Pa, preferably at temperatures of from 1400 to 1700° C.

The shaped sintered products formed remain in their shape during storage, transport and transfer into the evaporation apparatus and are stable in their composition throughout the subsequent melting and evaporation process.

The present invention likewise relates to the use of the vapor-deposition materials for the production of layers of high refractive index. All suitable substrates can be coated with the vapor-deposition material according to the invention, in particular discs, prisms, films, shaped substrates, such as optical lenses, spectacle lenses and objectives and the like, which may consist of the known suitable materials, such as various glasses or plastics. The use of the vapor-deposition materials according to the invention is therefore not subject to any restrictions at all with respect to the nature, size, shape, material and surface condition of the substrates to be coated, so long as the substrates can be introduced into the vacuum apparatus and remain stable under the prevailing temperature and pressure conditions. However, it has proven advantageous to warm the substrates before and during the coating so that the vapor-deposition material hits a preheated substrate in order to increase the density of the applied layers. Depending on their nature, the substrates employed are heated to temperatures of up to 300° C. However, this measure is known per se.

The vapor-deposition process employed is usually a high-vacuum vapor-deposition process in which the vapor-deposition material in a suitable container, which is also known as evaporation crucible or boat, is introduced into a vacuum apparatus together with the substrate to be coated.

The apparatus is subsequently evacuated, and the vapor-deposition material is brought to evaporation by heating and/or electron beam bombardment. In the process, the vapor-deposition material precipitates on the substrate in the form of a thin layer.

The use of complex methods in the coating, for example ion bombardment (ion assisted deposition, plasma assisted deposition), is unnecessary on use of the vapor-deposition materials according to the invention. This reduces the equipment complexity and thus lowers the costs for the coating, with simultaneous quality of the layers of high refractive index obtained.

Without further elaboration, it is believed that one skilled in the art can, using the preceding description, utilize the present invention to its fullest extent. The following preferred specific embodiments are, therefore, to be construed as merely illustrative, and not limitative of the remainder of the disclosure in any way whatsoever.

In the foregoing and in the following examples, all temperatures are set forth uncorrected in degrees Celsius and, all parts and percentages are by weight, unless otherwise indicated.

EXAMPLES

Example 1

Preparation of the Vapor-Deposition Material 97 percent by weight of tantalum oxide ($Ta_2O_5$) and 3 percent by weight of tantalum metal powder are mixed vigorously in a ball mill with addition of water. The mixture is subsequently dried and converted into grains having a particle size of from 1 to 4 mm. The grains are heated to 1650° C. at a heating rate of 1 K/min in a high-temperature vacuum oven in vacuo at a pressure of below $1\times10^{-4}$ mbar and held at this temperature for 32 hours. The material is subsequently cooled at 5 K/min. After cooling to 25° C., the vacuum oven is flooded with air, and the material is removed. The vapor-deposition material obtained consists of hard, dark-black grains having the composition $Ta_2O_{4.82}$.

Example 2

Use of the Vapor-Deposition Material for the Production of Layers of High Refractive Index A commercially available vapor-deposition unit (L560 from Leybold) is charged with cleaned quartz substrates. The vapor-deposition material from Example 1 is introduced into the water-cooled copper crucible of an electron beam evaporator device. The vapor-deposition unit is evacuated to a pressure of $1\times10^{-5}$ mbar. The substrate heating is then set to 200° C. After 1 hour, a uniform substrate temperature of about 160° C. has been reached. Oxygen is subsequently admitted into the unit using a control valve until a pressure of $2\times10^{-4}$ mbar becomes established. The vapor-deposition material is then melted under a screen and heated to the evaporation temperature. During melting and evaporation, no increase in pressure and no splashing by melt droplets occur. The screen is then opened. The vapor-deposition rate is adjusted to 0.2 nm/s using a vibrating quartz layer thickness measuring instrument. The substance is subsequently evaporated at this vapor-deposition rate until a layer thickness of 230 nm has been reached. Evaporation is then terminated.

The layer applied using the vapor-deposition material has a refractive index of 2.05 at 500 nm. The layer is homogeneous, i.e. the refractive index is constant over the entire layer thickness. The layer is absorption-free in the visible spectral region at wavelengths above 350 nm. The absorption only increases from about 300 nm steeply towards the ultraviolet spectral region.

The entire disclosure[s] of all applications, patents and publications, cited herein and of corresponding German application No. 10 2004 049 996.9, filed Oct. 14, 2004, is incorporated by reference herein.

The preceding examples can be repeated with similar success by substituting the generically or specifically described reactants and/or operating conditions of this invention for those used in the preceding examples.

From the foregoing description, one skilled in the art can easily ascertain the essential characteristics of this invention and, without departing from the spirit and scope thereof, can make various changes and modifications of the invention to adapt it to various usages and conditions.

The invention claimed is:

1. A vapor-deposition material comprising solid $Ta_2O_x$, wherein x=4.81 to 4.88.

2. A vapor-deposition material according to claim 1, comprising solid $Ta_2O_{4.82}$.

3. A vapor-deposition material according to claim 1, obtainable by mixing $Ta_2O_5$ with from 1.9 to 3.1% by weight of Ta, based on the mixture, compressing or suspending the mixture, shaping and subsequently sintering the mixture under reduced pressure.

4. A vapor-deposition material according to claim 2, obtainable by mixing $Ta_2O_5$ with 3% by weight of Ta, based on the mixture, compressing or suspending, shaping and subsequently sintering the mixture under reduced pressure.

5. A vapor-deposition material according to claims 1, in the form of tablets, pellets, discs, truncated cones, grains, granules, rods or spheres.

6. A process for the preparation of a vapor-deposition material comprising $Ta_2O_x$, wherein x=4.81-4.88, said process comprising mixing $Ta_2O_5$ with from 1.9 to 3.1% by weight of Ta, based on the mixture, compressing or suspending the mixture, shaping and subsequently sintering under reduced pressure, until a material with x=4.81-4.88 is formed and discontinuing sintering.

7. A process for the preparation of a vapor-deposition materials of the formula $Ta_2O_{4.82}$ comprising mixing $Ta_2O_5$ with 3% by weight of Ta, based on the mixture, the mixture, comprising or suspending, shaping and subsequently sintering under reduced pressure, until a material with x=4.82 is formed and discontinuing sintering.

8. A process according to claims 6, wherein sintering is carried out under reduced pressure at a temperature of 1300 to 1800° C.

9. A process according to claims 7, wherein sintering is carried out under reduced pressure at a temperature of 1300 to 1800° C.

10. A process according to claim 6, wherein the sintering is carried out under reduced pressure at a temperature of 1400 to 1700° C.

11. A process according to claim 7, wherein the sintering is carried out under reduced pressure at a temperature of 1400 to 1700° C.

12. A process according to claim 6, wherein the mixture is shaped into tablets, pellets, discs, truncated cones, grains, granules, rods or spheres.

13. A process according to claim 7, wherein the mixture is shaped into tablets, pellets, discs, truncated cones, grains, granules, rods or spheres.

14. A process for vapor-deposition of $Ta_2O_5$ on a substrate, comprising subjecting a vapor-deposition material according to claim 1, to vapor-deposition conditions in the presence of the substrate.

15. A process according to claim 14, wherein the substrate is an optical lens, spectacle lens, camera lens, binocular lens, beam splitter, prism, mirror or window.

* * * * *

UNITED STATES PATENT AND TRADEMARK OFFICE
CERTIFICATE OF CORRECTION

PATENT NO. : 7,598,196 B2
APPLICATION NO. : 11/249765
DATED : October 6, 2009
INVENTOR(S) : Friz et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 520 days.

Signed and Sealed this

Twenty-eighth Day of September, 2010

David J. Kappos
*Director of the United States Patent and Trademark Office*